(12) United States Patent
Yu et al.

(10) Patent No.: US 8,810,006 B2
(45) Date of Patent: Aug. 19, 2014

(54) INTERPOSER SYSTEM AND METHOD

(75) Inventors: Chen-Hua Yu, Hsin-Chu (TW);
Shin-Puu Jeng, Hsin-Chu (TW);
Shang-Yun Hou, Jubei (TW);
Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/572,240

(22) Filed: Aug. 10, 2012

(65) Prior Publication Data

US 2014/0042643 A1 Feb. 13, 2014

(51) Int. Cl.
*H01L 23/544* (2006.01)
*H01L 29/40* (2006.01)

(52) U.S. Cl.
USPC ........... 257/620; 257/621; 257/685; 257/723; 257/E23.169; 257/E23.174

(58) Field of Classification Search
USPC .................. 257/668, 737, 738, 778, E23.021, 257/E23.069, 685, 622, E25.005, 620, 777, 257/621, 723, E23.169, E23.174
See application file for complete search history.

(56) References Cited

U.S. PATENT DOCUMENTS

| | | | |
|---|---|---|---|
| 4,021,838 A * | 5/1977 | Warwick | 257/777 |
| 6,222,212 B1 * | 4/2001 | Lee et al. | 257/207 |
| 7,791,192 B1 * | 9/2010 | Joshi et al. | 257/724 |
| 8,415,783 B1 * | 4/2013 | Rahman et al. | 257/686 |
| 2009/0273098 A1 * | 11/2009 | Bartley et al. | 257/778 |

* cited by examiner

*Primary Examiner* — Jasmine Clark
(74) *Attorney, Agent, or Firm* — Slater and Matsil, L.L.P.

(57) ABSTRACT

A system and method for providing an interposer is provided. An embodiment comprises forming a first region and a second region on an interposer wafer with a scribe region between the first region and the second region. The first region and the second region are then connected to each other through circuitry located over the scribe region. In another embodiment, the first region and the second region may be separated from each other and then encapsulated together prior to the first region being connected to the second region.

20 Claims, 11 Drawing Sheets

INTERPOSER SYSTEM AND METHOD

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

As such, attention has been turned towards smaller packages that utilize less area than packages of the past, in some applications. One type of smaller packaging that has been developed is three-dimensional (3D) ICs, in which two die or ICs are bonded together and electrical connections are formed between the individual die using contact pads located on an interposer.

In these situations, power and signal lines may be passed through the interposer. These lines may be in the form of connections from one side of the interposer to dies or other electrical connections on an opposing side of the interposer.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely an interposer for semiconductor chips. Other embodiments may also be applied, however, to other types of connection devices.

Figure 1:
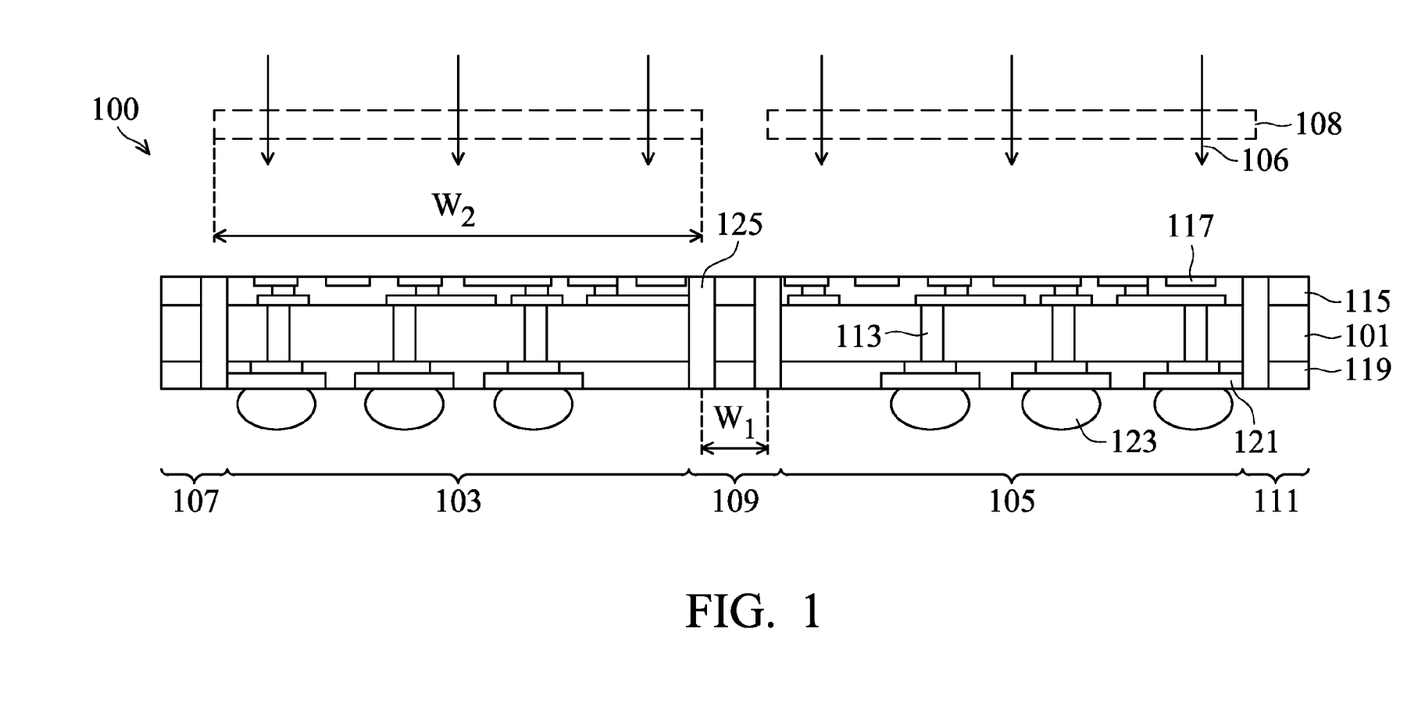
FIG. 1 illustrates a first interposer region and a second interposer region in accordance with an embodiment.

With reference now to FIG. 1, there is shown an interposer wafer 100 with a substrate 101, a first interposer region 103, a second interposer region 105, a first scribe region 107, a second scribe region 109, and a third scribe region 111. The substrate 101 for the interposer wafer 100 may be, e.g., a silicon substrate, doped or undoped, or an active layer of a silicon-on-insulator (SOI) substrate, used to provide support for the interposer wafer 100. However, the substrate 101 may alternatively be a glass substrate, a ceramic substrate, a polymer substrate, or any other substrate that may provide a suitable protection and/or interconnection functionality. These and any other suitable materials may alternatively be used for the substrate 101.

The substrate 101 may be divided into the first interposer region 103 and the second interposer region 105. The first interposer region 103 and the second interposer region 105 are designed to be connected to semiconductor dies such as processors and memory dies (not illustrated in FIG. 1 but illustrated and described below with respect to FIG. 3A) and to provide support and connectivity to the semiconductor dies once the first interposer region 103 and the second interposer region 105 have been separated from the interposer wafer 100.

The first scribe region 107, the second scribe region 109, and the third scribe region 111 are located between and separate the various interposer regions (such as the first interposer region 103 and the second interposer region 105 illustrated in FIG. 1) on the interposer wafer 100. In an embodiment the first scribe region 107, the second scribe region 109, and the third scribe region 111 are regions of the interposer wafer 100 into which no active circuitry is formed, or where no circuitry that will be utilized after the interposer wafer 100 is formed. As such, when it is desired that the first interposer region 103 and the second interposer region 105 be removed from the interposer wafer 100, the first scribe region 107 and the third scribe region 111 may be used as regions to remove in order without damaging the circuitry within the first interposer region 103 and the second interposer region 105.

In an embodiment, the first scribe region 107, the second scribe region 109, and the third scribe region 111 may be formed during the manufacturing of other features on the interposer wafer 100 and may have a first width $w_1$ of between about 60 µm and about 160 µm, such as about 80 µm. For example, in one embodiment described herein, the first scribe region 107, the second scribe region 109, and the third scribe region 111 may be formed along with the formation of through substrate vias (TSVs) 113, first metallization layers 115, first contact pads 117. The first scribe region 107, the second scribe region 109, and the third scribe region 111 may be formed at the same time as these structures and other structures as described below.

Using a particular example, portions of the first scribe region 107, the second scribe region 109, and the third scribe region 111 may be formed during the manufacturing of the first metallization layer 115, which may use, for example, a series of photolithographic masking and etching processes, in which a series of photoresists, such as a first photoresist (not individually illustrated in FIG. 1), are applied and developed to be used as masks for the patterning of underlying layers. The first photoresist may be, e.g., a deep ultra-violet (DUV) photoresist and may be deposited on the interposer wafer 100 by using a spin-on process to place the first photoresist at the appropriate point in the manufacturing process.

Once the first photoresist has been placed, the first photoresist may be exposed to energy (represented in FIG. 1 by the arrows labeled 106), e.g., light, through a patterned reticle (not individually illustrated in FIG. 1) to form a reticle field 108 that will impact the first photoresist in order to induce a reaction in those portions of the first photoresist exposed to the energy. Because the reticle field 108, which may have a second width $w_2$ of between about 13 mm and about 64 mm, such as about 32 mm, and a length (not illustrated in FIG. 1) of between about 13 mm and about 52 mm, such as about 26 mm, is not large enough to cover the interposer wafer 100 in a single exposure, sections of the interposer wafer 100 are exposed in a stepwise fashion by exposing a section of the interposer wafer 100 (such as the first interposer region 103) and then stepping to another section of the interposer wafer 100 (such as the second interposer region 105). In such a fashion, the interposer wafer 100 may be patterned by stepping through and exposing each section of the interposer wafer 100.

Using a stepwise exposure systems, the first scribe region 107, the second scribe region 109, and the third scribe region 111 may be formed by exposing a first region (e.g., the first interposer region 103) and then exposing an adjacent second region (e.g., the second interposer region 105) at a distance laterally removed from the first region, thereby leaving an unexposed region between the first interposer region 103 and the second interposer region 105. This unexposed region between the first interposer region 103 and the second interposer region 105 will become the second scribe region 109 because no processing in being performed upon it, thereby leaving the second scribe region 109 devoid of any functional circuitry. A similar stepping pattern may be used to form the first scribe region 107 and the third scribe region 111.

However, the stepwise non-exposing of the interposer wafer 100 is not the only method by which the first scribe region 107, the second scribe region 109, and the third scribe region 111 may be formed. For example, the first scribe region 107, the second scribe region 109, and the third scribe region 111 may be exposed along with their respective adjacent interposer regions (e.g., the first interposer region 103 or the second interposer region 105), bu the exposure may leave the first scribe region 107, the second scribe region 109, and the third scribe region 111 empty of functional circuitry. Alternatively, in embodiments in which test circuits or other structures may be desired to be placed in the first scribe region 107, the second scribe region 109, and the third scribe region 111, but which will not be utilized once the first interposer region 103 and the second interposer region 105 have been separated from the interposer wafer 100, the first scribe region 107, the second scribe region 109, and the third scribe region 111 may be patterned with those structures.

Additionally, the same patterned reticle in the same orientation may be utilized for each step of the exposure, thereby forming a similar reticle filed 108 and forming symmetrical structures in the same layout on each section of the interposer wafer 100 (e.g., the first interposer region 103 and the second interposer region 105). In another embodiment, if desired, the same patterned reticle may be utilized in another orientation (such as rotated 180°) may be utilized for different sections. By using the same patterned reticle, the overall process may be cheaper and more efficient. However, in other embodiments, different patterned reticules may be utilized for each of the exposures. By forming such a combination exposure for the interposer wafer 100, a more detailed and specific pattern may be formed within the interposer wafer 100.

As examples of the manufacturing processes which may be utilized to form structures over and within the interposer wafer 100 and also used to form the first scribe region 107, the second scribe region 109, and the third scribe region 111, through substrate vias (TSVs) 113 may be formed through the substrate 101, first metallization layers 115 and first contact pads 117 may be formed over a first side of the substrate 101, and second metallization layers 119 and second contact pads 121 may be made over a second side of the substrate 101. First external connectors 123 may be formed in contact with the second contact pads 121 to help provide electrical connectivity. Each of these structures is discussed in greater detail in the following paragraphs.

The TSVs 113 may be formed by applying and developing a suitable photoresist (e.g., the first photoresist discussed above, not shown), and then etching the substrate 101 to generate TSV openings (filled later as discussed below). The openings for the TSVs 113 at this stage may be formed so as to extend into the substrate 101 to a depth at least greater than the eventual desired height of the finished interposer wafer 100. Accordingly, while the depth is dependent upon the overall design of the interposer wafer 100, the depth may be between about 1 µm and about 700 µm below the surface on the substrate 101, with a preferred depth of about 50 µm. The openings for the TSVs 113 may be formed to have a diameter of between about 1 µm and about 100 µm, such as about 6 µm.

Once the openings for the TSVs 113 have been formed, the openings for the TSVs 113 may be filled with, e.g., a barrier layer and a conductive material. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the TSVs 113.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the TSVs 113. Once the openings for the TSVs 113 have been filled, excess barrier layer and excess conductive material outside of the openings for the TSVs 113 may be removed through a grinding process such as chemical mechanical polishing (CMP), although any suitable removal process may be used.

Once the conductive material is within the openings for the TSVs 113, a thinning of the second side of the substrate 101 may be performed in order to expose the openings for the TSVs 113 and form the TSVs 113 from the conductive material that extends through the substrate 101. In an embodiment, the thinning of the second side of the substrate 101 may leave the TSVs 113. The thinning of the second side of the substrate 101 may be performed by a planarization process such as CMP or etching.

However, as one of ordinary skill in the art will recognize, the above described process for forming the TSVs 113 is merely one method of forming the TSVs 113, and other methods are also fully intended to be included within the scope of the embodiments. For example, forming the openings for the TSVs 113, filling the openings for the TSVs 113 with a dielectric material, thinning the second side of the substrate 101 to expose the dielectric material, removing the dielectric material, and filling the openings for the TSVs 113 with a conductor may also be used. This and all other suitable methods for forming the TSVs 113 into the substrate 101 are fully intended to be included within the scope of the embodiments.

Alternatively, the TSVs 113 may be formed to extend through layers of the interposer wafer 100 located over the substrate 101 such as the first metallization layers 115 (described further below). For example, the TSVs 113 may be formed either after the formation of the first metallization layers 115 or else even partially concurrently with the metallization layers 115. For example, the openings for the TSVs 113 may be formed in a single process step through both the first metallization layers 115 and the substrate 101. Alternatively, a portion of the openings for the TSVs 113 may be formed and filled within the substrate 101 prior to the formation of the first metallization layers 115, and subsequent layers of the openings for the TSVs 113 may be formed and filled as each of the first metallization layers 115 are individually formed. Any of these processes, and any other suitable process by which the TSVs 113 may be formed, are fully intended to be included within the scope of the embodiments.

The first metallization layers 115 are formed over the first side of the substrate 101 and are designed to interconnect the first side of the substrate 101 to external devices on the second side of the substrate 101 (e.g., the first semiconductor die 301, a second semiconductor die 303, and a third semiconductor die 305, not illustrated in FIG. 1 but illustrated and discussed below with respect to FIG. 3A). While illustrated in FIG. 1 as a single layer of dielectric and interconnects, the first metallization layers 115 are formed of alternating layers of dielectric and conductive material and may be formed through any suitable process (such as deposition, damascene, dual damascene, etc.). In an embodiment there may be one or more layers of metallization, but the precise number of layers within the first metallization layers 115 is dependent at least in part upon the design of the interposer wafer 100.

The first contact pads 117 may be formed over and in electrical contact with the first metallization layers 115. The first contact pads 117 may comprise aluminum, but other materials, such as copper, may alternatively be used. The first contact pads 117 may be formed using a deposition process, such as sputtering, to form a layer of material (not shown) and portions of the layer of material may then be removed through a suitable process (such as photolithographic masking and etching) to form the first contact pads 117. However, any other suitable process, such as forming an opening into a dielectric, depositing the material for the first contact pads 117, and then planarizing the material and the dielectric, may be utilized to form the first contact pads 117. The first contact pads 117 may be formed to have a thickness of between about 0.5 μm and about 4 μm, such as about 1.45 μm.

The second metallization layers 119 are formed over the second side of the substrate 101 and are designed to interconnect the second side of the substrate 101 to external contacts. While illustrated in FIG. 1 as a single layer of dielectric and interconnects, the second metallization layers 119 are formed of alternating layers of dielectric and conductive material and may be formed through any suitable process (such as deposition, damascene, dual damascene, etc.). In an embodiment there may be one or more layers of metallization, but the precise number of layers within the second metallization layers 119 is dependent at least in part upon the design of the interposer wafer 100.

The second contact pads 121 may be formed over and in electrical contact with the second metallization layers 119 on the second side of the substrate 101. The second contact pads 121 may comprise aluminum, but other materials, such as copper, may alternatively be used. The second contact pads 121 may be formed using a deposition process, such as sputtering, to form a layer of material (not shown) and portions of the layer of material may then be removed through a suitable process (such as photolithographic masking and etching) to form the second contact pads 121. However, any other suitable process, such as forming an opening into a dielectric, depositing the material for the second contact pads 121, and then planarizing the material and the dielectric, may be utilized to form the second contact pads 121. The second contact pads 121 may be formed to have a thickness of between about 0.5 μm and about 4 μm, such as about 1.45 μm.

The first external connectors 123 may be formed to provide an external connection between the second contact pads 121 and external devices (not individually illustrated in FIG. 1). The first external connectors 123 may be contact bumps such as microbumps or controlled collapse chip connection (C4) bumps and may comprise a material such as tin, or other suitable materials, such as silver or copper. In an embodiment in which the first external connectors 123 are tin solder bumps, the first external connectors 123 may be formed by initially forming a layer of tin through any suitable method such as evaporation, electroplating, printing, solder transfer, ball placement, etc, to a preferred thickness of about 100 μm. Once a layer of tin has been formed on the structure, a reflow is preferably performed in order to shape the material into the desired bump shape.

Optionally, seal rings 125 may be formed around the first interposer region 103 and the second interposer region 105 in order to separate the first interposer region 103 and the second interposer region 105 from the first scribe region 107, the second scribe region 109, and the third scribe region 111. The seal rings 125 may be used to help protect the functional components of the first interposer region 103 and the second interposer region 105. Additionally, if desired, the seal rings 125 could be electrically connected to the functional circuit elements within the first interposer region 103 and the second interposer region 105 in order to provide an electrical connection to those elements. The seal rings 125 may comprise a conductive material such as copper, aluminum, tungsten, alloys of these, and the like. However, other materials, such as layers of conductive and insulative materials, could alternatively be used. The seal rings 125 may be formed to have a width of between about 5 μm and about 300 μm, such as about 10 μm.

Figure 2:
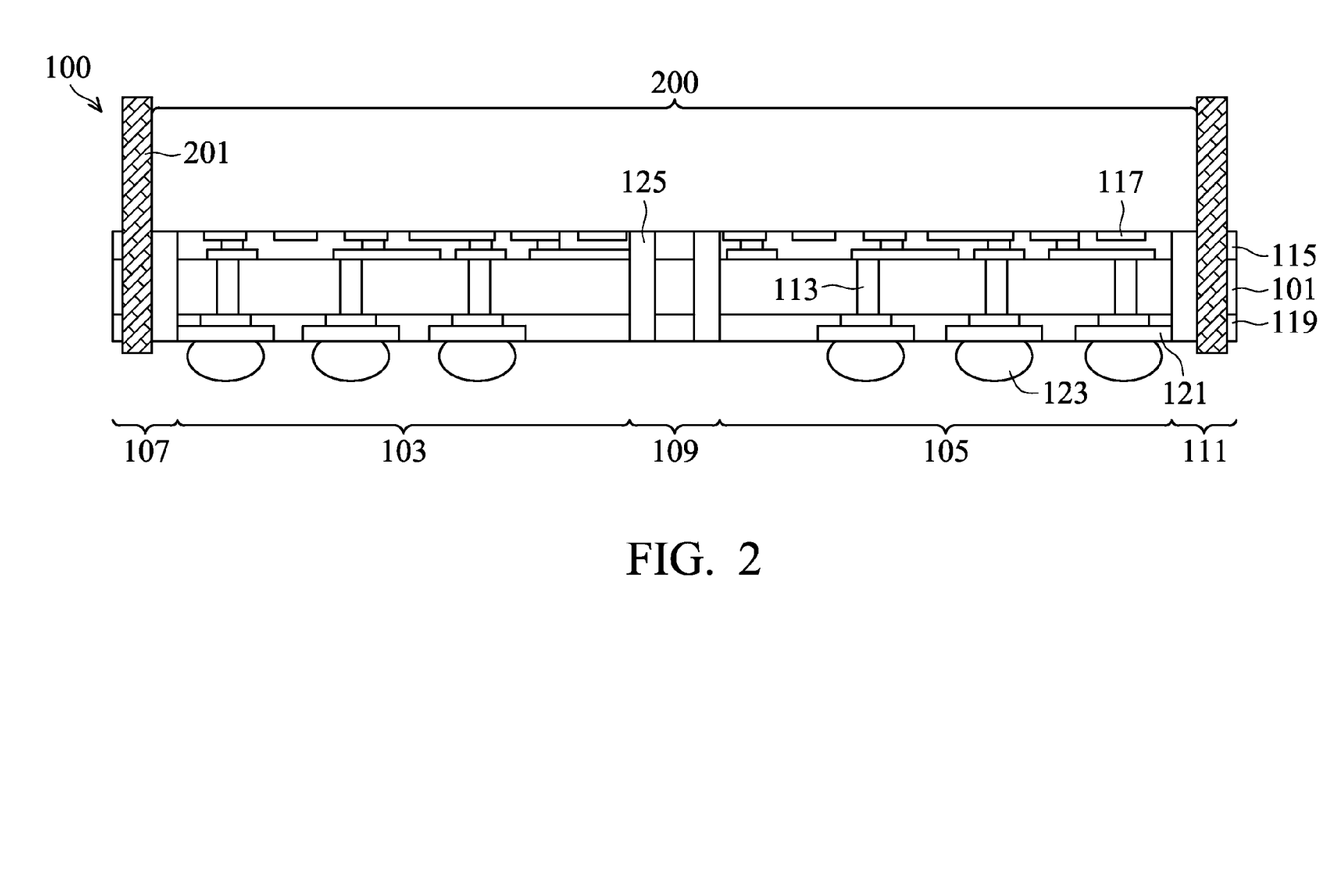
FIG. 2 illustrates a separation of the first interposer region and the second interposer region in accordance with an embodiment.

FIG. 2 illustrates a scribing that may be performed to separate the interposer wafer 100 into individual interposers. In an embodiment the individual interposers are separated from the interposer wafer 100 using, e.g., a diamond coated saw 201 that is used to cut the interposer wafer 100 along the scribe lines such as the first scribe region 107 and the third scribe region 111. However, in alternative embodiments, other scribing methods, such as using a laser scriber or using a series of etches or other separation processes, may also be utilized to scribe the interposer wafer 100 into individual interposers.

Additionally, in an embodiment, while the diamond coated saw 201 is used to cut the interposer wafer 100 along the first scribe region 107 and the third scribe region 111, the diamond coated saw 201 is not used to cut the second scribe region 109. By not cutting through the second scribe region 109, the first interposer region 103 and the second interposer region 105, while being separated from the rest of the interposer wafer 100, will remain fixed to each other. By keeping the first interposer region 103 and the second interposer region 105 fixed to each other, a single interposer 200 that is larger than the exposure field of the photolithographic processes may be obtained. For example, the single interposer 200 may have a first width of between about 32 mm and about 52 mm, such as about 42 mm.

However, as one of ordinary skill in the art will recognize, the separation of the first interposer region 103 and the second interposer region 105 at this stage is merely intended to be illustrative and is not intended to be limiting. Rather, the first interposer region 103 and the second interposer region 105 may be separated at any desired stage during the manufacturing process, including after the attachment of semiconductor dies (e.g., the first semiconductor die 301, the second semiconductor die 303, and the third semiconductor die 305 discussed below with respect to FIGS. 3A-3B). Any suitable time for separating the first interposer region 103 and the second interposer region 105 may be utilized, and all such times are fully intended to be included in the embodiments.

Figure 3A:
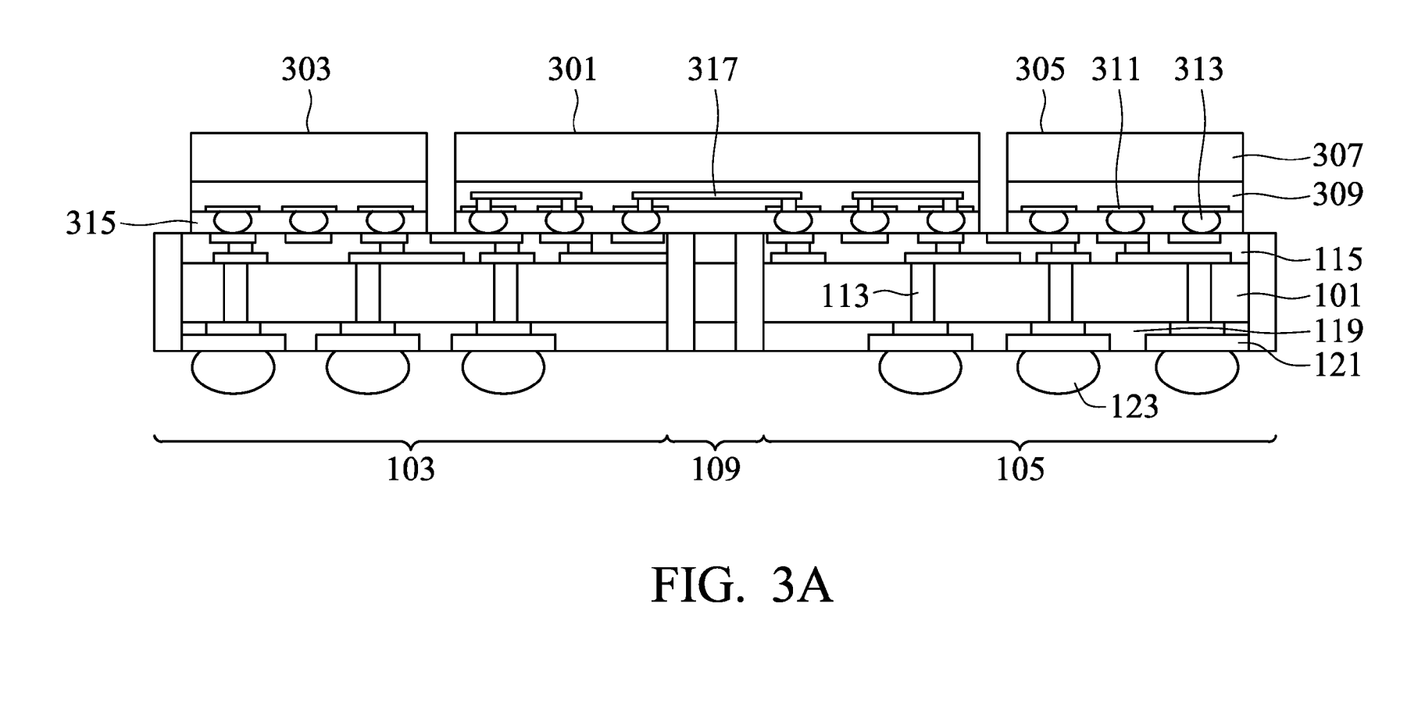
FIG. 3A-3D illustrate connections of a first semiconductor die, a second semiconductor die, and a third semiconductor die to the first interposer region and the second interposer region in accordance with an embodiment.

FIG. 3A illustrates a connection of the single interposer 200 to a first semiconductor die 301, a second semiconductor die 303, and a third semiconductor die 305. In an embodiment the first semiconductor die 301 may be, e.g., a logic die such as a graphics processing unit, while the second semiconductor die 303 and the third semiconductor die 305 may be memory dies. However, any suitable combination of semiconductor dies, and any number of semiconductor dies, may alternatively be utilized, and all such numbers, combinations, and functionalities are fully intended to be included within the scope of the embodiments.

Figure 3B:
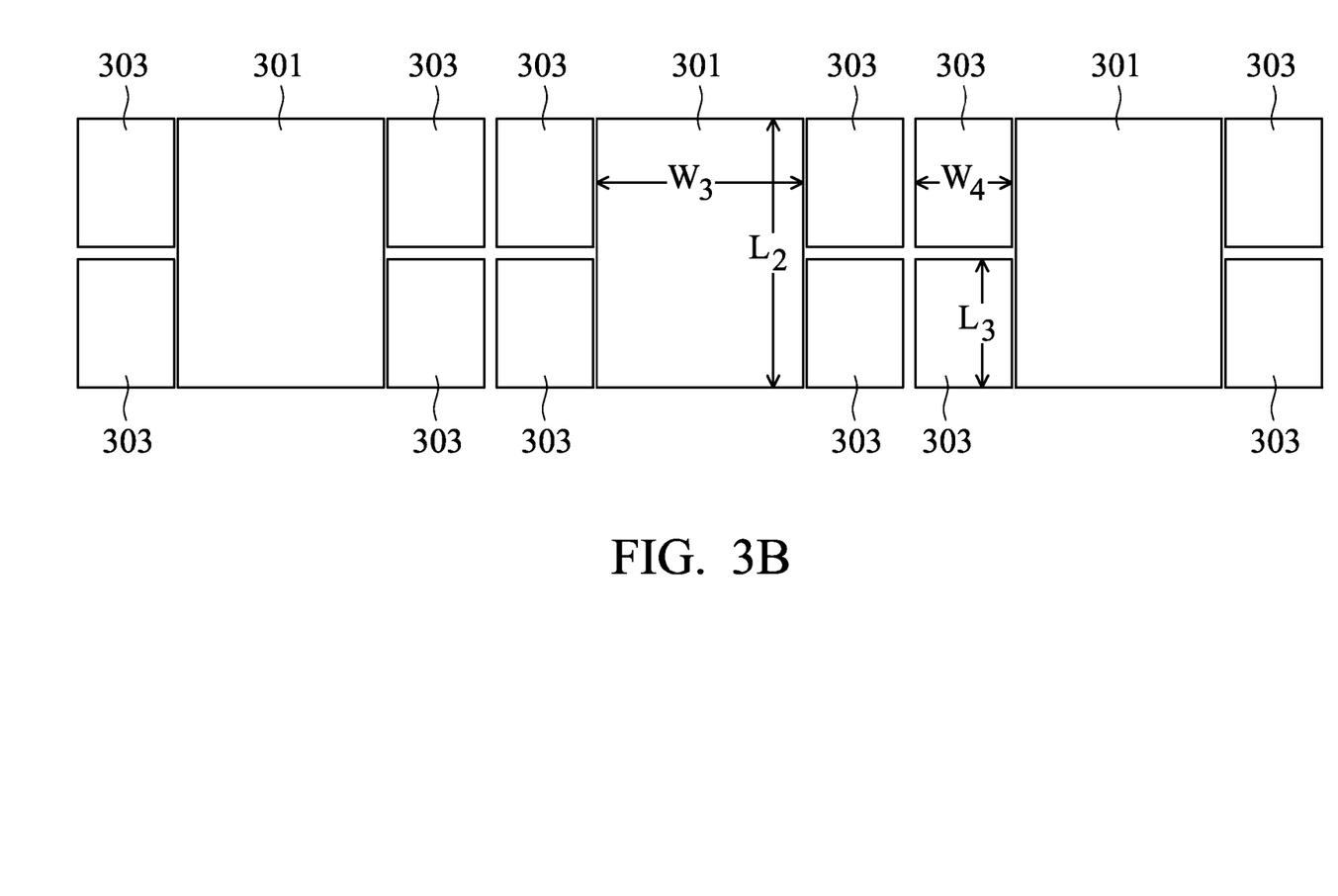

FIG. 3B illustrates a plan view of one embodiment of a repeatable Logicx1+DRAMx4 layout for the first semiconductor die 301, the second semiconductor die 303, and the third semiconductor die 305. In an embodiment multiple ones of the second semiconductor die 303 and the third semiconductor die 305 may be arranged around a centrally located first semiconductor die 301. In an embodiment the first semiconductor die 301 (e.g., a logic die) may have a third width $w_3$ of between about 11 mm and about 33 mm, such as about 22 mm, and a second length $l_2$ of between about 16 mm and about 36 mm, such as about 26 mm. The second semiconductor dies 303 (e.g., DRAM) may have a fourth width $w_4$ of between about 7 mm and about 14 mm, such as about 7 mm and may have a third length $l_3$ of between about 7 mm and about 17 mm, such as about 12 mm. This layout of connections may be repeated across the interposer wafer 100.

Figure 3C:
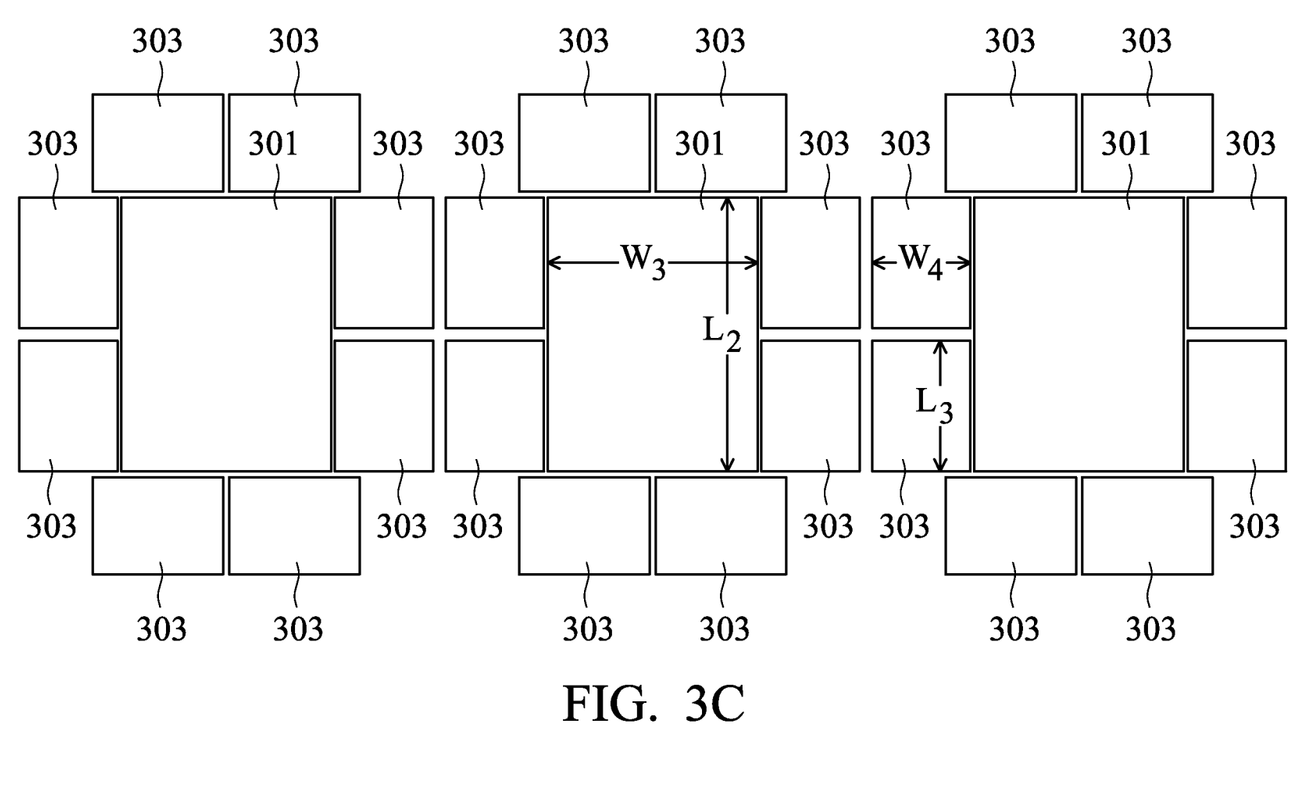

FIG. 3C illustrates an alternative layout that may utilize a Logicx1+DRAMx8 pattern. In this embodiment six of the second semiconductor die 303 and the third semiconductor die 305 are located around the first semiconductor die 301. For example, two ones of the second semiconductor dies 303 may be located on each side of the first semiconductor die 301.

Figure 3D:
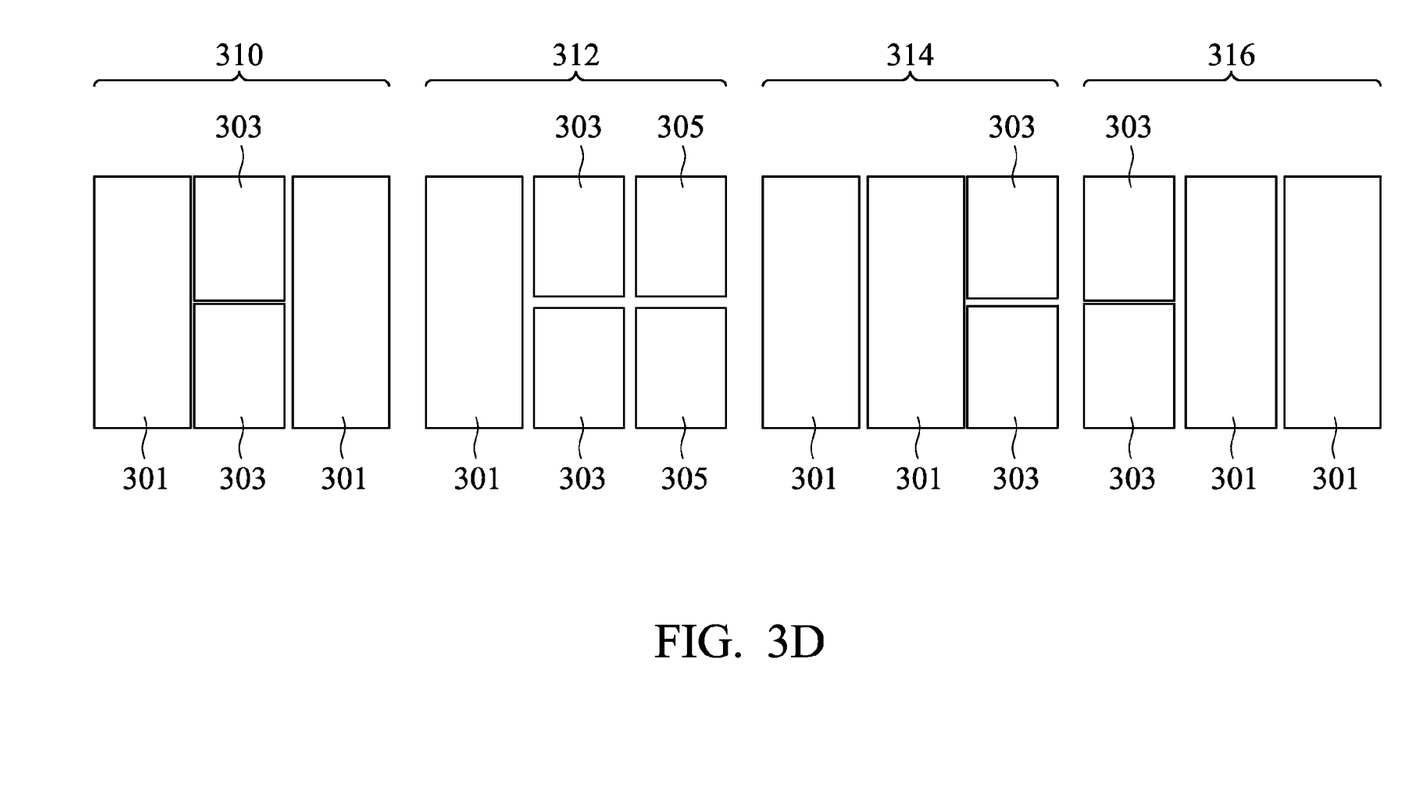

FIG. 3D illustrates more layouts of the first semiconductor die 301, the second semiconductor die 303, and the third semiconductor dies 305 that may be utilized. In a first region 310 the first semiconductor die 301 on opposing sides of two of the second semiconductor dies 303. In a second region 312 a single core of the first semiconductor die 301 is located adjacent to the second semiconductor dies 303 and the third semiconductor dies 305. In a third region 314, two cores of the first semiconductor die 301 are arranged adjacent to two of the second semiconductor dies 303. In a fourth region 316 the layout of the third region 314 is switched. These and all other suitable layouts are fully intended to be included within the scope of the embodiments.

Returning now to FIG. 3A, in an embodiment each one of the first semiconductor die 301, a second semiconductor die 303, and a third semiconductor die 305 individually comprise a second substrate 307, active devices (not individually illustrated in FIG. 3A), third metallization layers 309, third contact pads 311, and second external connectors 313. The second substrates 307 may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the second substrates 307 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The second substrates 307 may be doped with a p-type dopant, such as boron, aluminum, gallium, or the like, although the substrate may alternatively be doped with an n-type dopant, as is known in the art.

Each of the first semiconductor die 301, the second semiconductor die 303, and the third semiconductor die 305 may have active devices formed on their respective second substrate 307. As one of skill in the art will recognize, a wide variety of active and passive devices such as capacitors, resistors, inductors and the like may be used to generate the desired structural and functional requirements of the design. For example, capacitor coupled with transistors may be utilized to form memory cells in the second semiconductor die 303 and the third semiconductor die 305. The active devices may be formed using any suitable methods either within or else on the surface of the respective second substrates 307.

The third metallization layers 309 may be formed over the respective second substrate 307 and the active devices and are designed to connect the various first active devices on their respective dies to form functional circuitry. The third metallization layers 309 may be formed of alternating layers of dielectric and conductive material and may be formed through any suitable process (such as deposition, damascene, dual damascene, etc.). In an embodiment, there may be four layers of metallization separated from the second substrates 307 by at least one interlayer dielectric layer (ILD), but the precise number of third metallization layers 309 is dependent upon the design of the first semiconductor die 301, the second semiconductor die 303, and the third semiconductor die 305, respectively.

Additionally, the third metallization layers 309 within the first semiconductor die 301 may be patterned to also provide a connection pathway 317 between the first interposer region 103 and the second interposer region 105 within the single interposer 200. The connection pathway 317 within the first semiconductor die 301 may be utilized to pass signals and/or power between the first interposer region 103 and the second interposer region 105 and to use the first interposer region 103 and the second interposer region 105 as a single unit instead of as two separate and distinct units. In an embodiment the connection pathway 317 may be formed so that, when the first semiconductor die 301 is connected to the single interposer 200, the connection pathway 317 will pass over the second scribe region 109 and the seal rings 125 to create the electrical connection between the first interposer region 103 and the second interposer region 105.

The third contact pads 311 may be formed over and in electrical contact with the third metallization layers 309 on the respective dies. The third contact pads 311 may comprise aluminum, but other materials, such as copper, may alternatively be used. The third contact pads 311 may be formed using a deposition process, such as sputtering, to form a layer of material (not shown) and portions of the layer of material may then be removed through a suitable process (such as photolithographic masking and etching) to form the third contact pads 311. However, any other suitable process, such as forming an opening into a dielectric, depositing the material for the third contact pads 311, and then planarizing the material and the dielectric, may be utilized to form the third contact pads 311. The third contact pads 311 may be formed to have a thickness of between about 0.5 µm and about 4 µm, such as about 1.45 µm.

The second external connectors 313 may be formed to provide an external connection between the third contact pads 311 and the single interposer 200. The second external connectors 313 may be contact bumps such as micro-bumps or controlled collapse chip connection (C4) bumps and may comprise a material such as tin, or other suitable materials, such as silver or copper. In an embodiment in which the second external connectors 313 are tin solder bumps, the second external connectors 313 may be formed by initially forming a layer of tin through any suitable method such as evaporation, electroplating, printing, solder transfer, ball placement, etc, to a preferred thickness of about 100 µm. Once a layer of tin has been formed on the structure, a reflow is preferably performed in order to shape the material into the desired bump shape.

Additionally, dummy bumps (not individually illustrated in FIG. 3A) may be utilized between the single interposer 200 and any of the devices the single interposer 200 may be connected to, such as the first semiconductor die 301, the second semiconductor die 303, and the third semiconductor die 305. These dummy bumps may be utilized to provide support to the structures and reduce stresses that may build up. By providing such support, damage may be prevented during repeated thermal and environmental cycling that may occur during storage and use.

The first semiconductor die 301, the second semiconductor die 303, and the third semiconductor die 305 may be placed onto the single interposer 200. In an embodiment the first semiconductor die 301, the second semiconductor die 303, and the third semiconductor die 305 may be placed onto the single interposer 200 with the first contact pads 117 facing and aligned with the second external connectors 313. Once aligned, the second external connectors 313 and the first contact pads 117 may then be bonded together by contacting the second external connectors 313 to the first contact pads 117 and performing a reflow to reflow the material of the second external connectors 313 and bond to the first contact pads 117. Any suitable method of bonding, however, such as copper-copper bonding, may alternatively be utilized to bond the first semiconductor die 301, the second semiconductor die 303, and the third semiconductor die 305 to the single interposer 200.

An underfill material 315 may be injected or otherwise formed in the space between the first semiconductor die 301, the second semiconductor die 303, and the third semiconductor die 305 and the single interposer 200. The underfill material 315 may, for example, comprise a liquid epoxy that is dispensed between the first semiconductor die 301, the second semiconductor die 303, and the third semiconductor die 305, and the single interposer 200, and then cured to harden. This underfill material 315 may be used to prevent cracks from being formed in the second external connectors 313, wherein cracks are typically caused by thermal stresses.

Alternatively, either a deformable gel or silicon rubber could be formed between the first semiconductor die 301, the second semiconductor die 303, and the third semiconductor die 305 and the single interposer 200 in order to help prevent cracks from occurring within the second external connectors 313. This gel or silicon rubber may be formed by injecting or otherwise placing the gel or rubber between the first semiconductor die 301, the second semiconductor die 303, and the third semiconductor die 305 and the single interposer 200. The deformable gel or silicon rubber may also provide stress relief during subsequent processing.

By maintaining the connection between the first interposer region 103 and the second interposer region 105, and by forming a connection pathway 317 over the second scribe region 109 to electrically interconnect the first interposer region 103 and the second interposer region 105, the size limits on single interposers set by the photolithographic process may be overcome. This allows more flexibility in the design and use of interposers and to the number and type of connections that the semiconductor dies and other devices to which the interposers may be connected.

Figure 4:
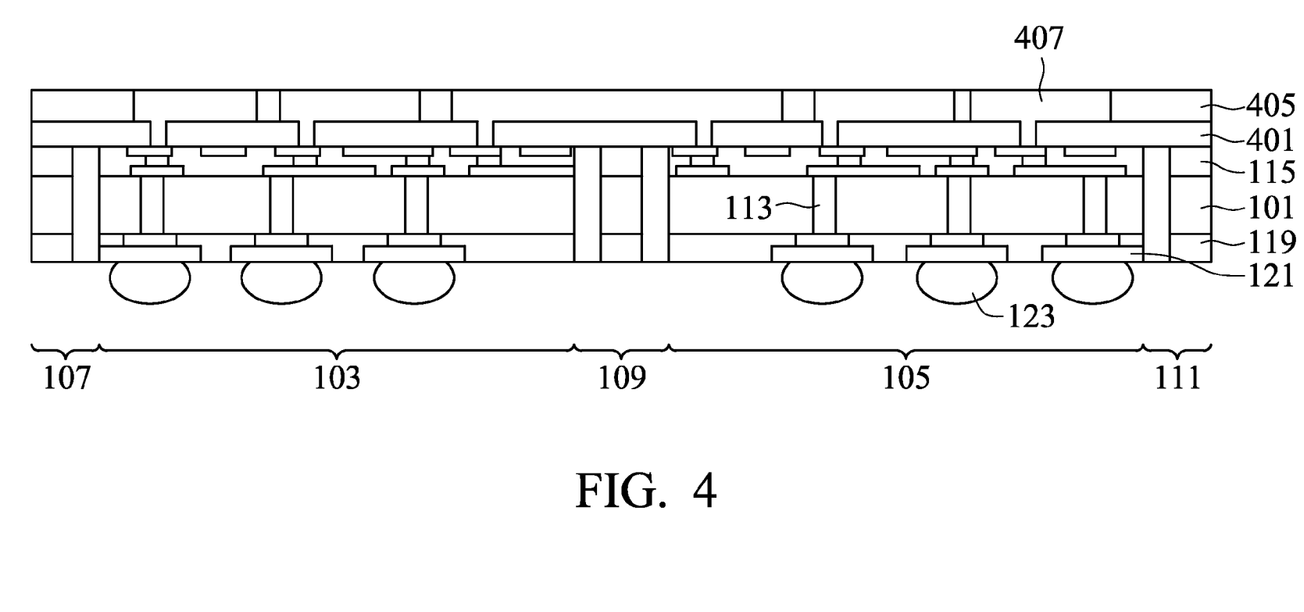
FIG. 4 illustrates a formation of a post-passivation interconnect to connect the first interposer region and the second interposer region in accordance with an embodiment.

FIG. 4 illustrates another embodiment in which, instead of the first interposer region 103 being connected to the second interposer region 105 through the first semiconductor die 301, the first interposer region 103 is connected to the second interposer region 105 through a post-passivation interconnect (PPI) 407 formed over the first interposer region 103, the second interposer region 105, and the second scribe region 109. However, because the photolithographic exposure fields for the PPI 407 are not as limited as the photolithographic exposure fields for the first interposer region 103 and the second interposer region 105, the photolithographic masking and etching processes for forming the PPI 407 may be used to pattern both the first interposer region 103 and the second interposer region 105 at the same time.

In an embodiment the PPI 407 may be formed by first forming a first passivation layer 401 on the substrate 101 over the first metallization layers 115 and the first contact pads 117. The first passivation layer 401 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 401 may be formed through a process such as chemical vapor deposition (CVD), although any suitable process may be utilized, and may have a thickness between about 0.5 µm and about 5 µm, such as about 9.25 KÅ.

After the first passivation layer 401 has been formed, an opening may be made through the first passivation layer 401 by removing portions of the first passivation layer 401 to expose at least a portion of the underlying first contact pads 117. The opening allows for contact between the first contact pads 117 and the PPI 407 (discussed further below). The opening may be formed using a suitable photolithographic mask and etching process, although any suitable process to expose portions of the first contact pads 117 may be used.

After the first contact pads 117 have been exposed, the PPI 407 may be formed to extend along the first passivation layer 401. The PPI 407 may be utilized as a redistribution layer to allow the first interposer region 103 and the second interposer region 105 to be electrically interconnected to each other through the PPI 407, as well as for providing additional flexibility in the routing of signals and power between the first semiconductor die 301, the second semiconductor die 303, the third semiconductor die 305, and the single interposer 200. In an embodiment the PPI 407 may be formed by initially forming a seed layer (not shown) of a titanium copper alloy through a suitable formation process such as CVD or sputtering. A photoresist (not shown) may then be formed to cover the seed layer, and the photoresist may then be patterned to expose those portions of the seed layer that are located where the PPI 407 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the substrate 101 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI 407.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 407 has been formed, a second passivation layer 405 may be formed to protect the PPI 407 and the other underlying structures. The second passivation layer 405 may be formed from a polymer such as polyimide, or may alternatively be formed of a similar material as the first passivation layer 401 (e.g., silicon oxides, silicon nitrides, low-k dielectrics, extremely low-k dielectrics, combinations of these, and the like). The second passivation layer 405 may be formed to have a thickness of between about 2 μm and about 15 μm, such as about 5 μm, and may be planarized with the PPI 407 through a process such as CMP.

Figure 5:
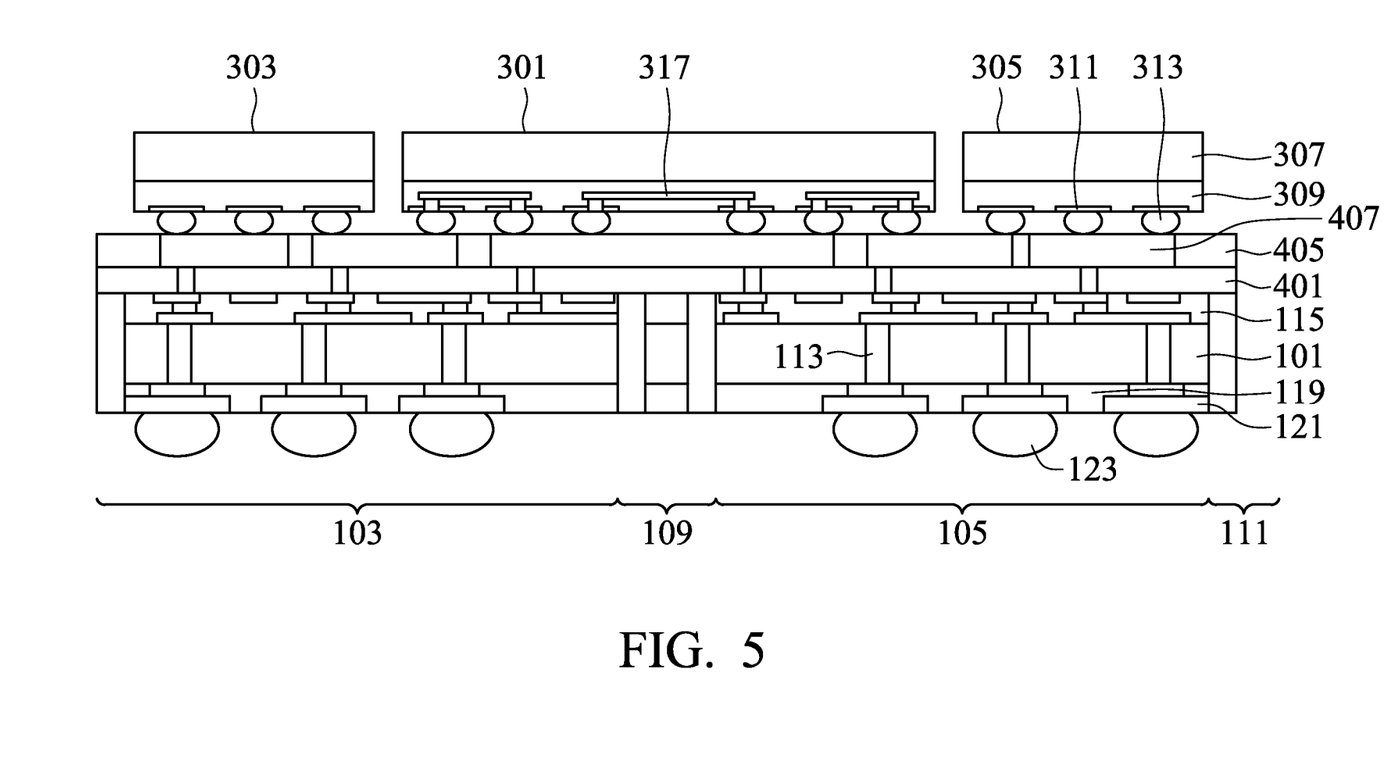
FIG. 5 illustrates a connection of a first semiconductor die, a second semiconductor die, and a third semiconductor die to the post-passivation interconnect in accordance with an embodiment.

FIG. 5 illustrates a placement of the first semiconductor die 301, the second semiconductor die 303, and the third semiconductor die 305 in connection with the single interposer 200 through the PPI 407 after the first interposer region 103 and the second interposer region 105 have been separated from the interposer wafer 100. In an embodiment the first semiconductor die 301, the second semiconductor die 303, and the third semiconductor die 305 may be placed onto the single interposer with the first contact pads 117 facing and aligned with the PPI 407. Once aligned, the second external connectors 313 and the PPI 407 may then be bonded together by contacting the second external connectors 313 to the PPI 407 and performing a reflow to reflow the material of the second external connectors 313 and bond to the PPI 407. Any suitable method of bonding, however, such as copper-copper bonding, may alternatively be utilized to bond the first semiconductor die 301, the second semiconductor die 303, and the third semiconductor die 305 to the PPI 407.

By forming the PPI 407 over the second scribe region 109, the PPI 407 helps to electrically interconnect the first interposer region 103 and the second interposer region 105. This interconnection of the first interposer region 103 and the second interposer region 105 helps to utilize the first interposer region 103 and the second interposer region 105 as a single interposer instead of multiple interposers that are only physically attached to each other. This integration makes the single interposer 200 more efficient and integrated.

Figure 6:
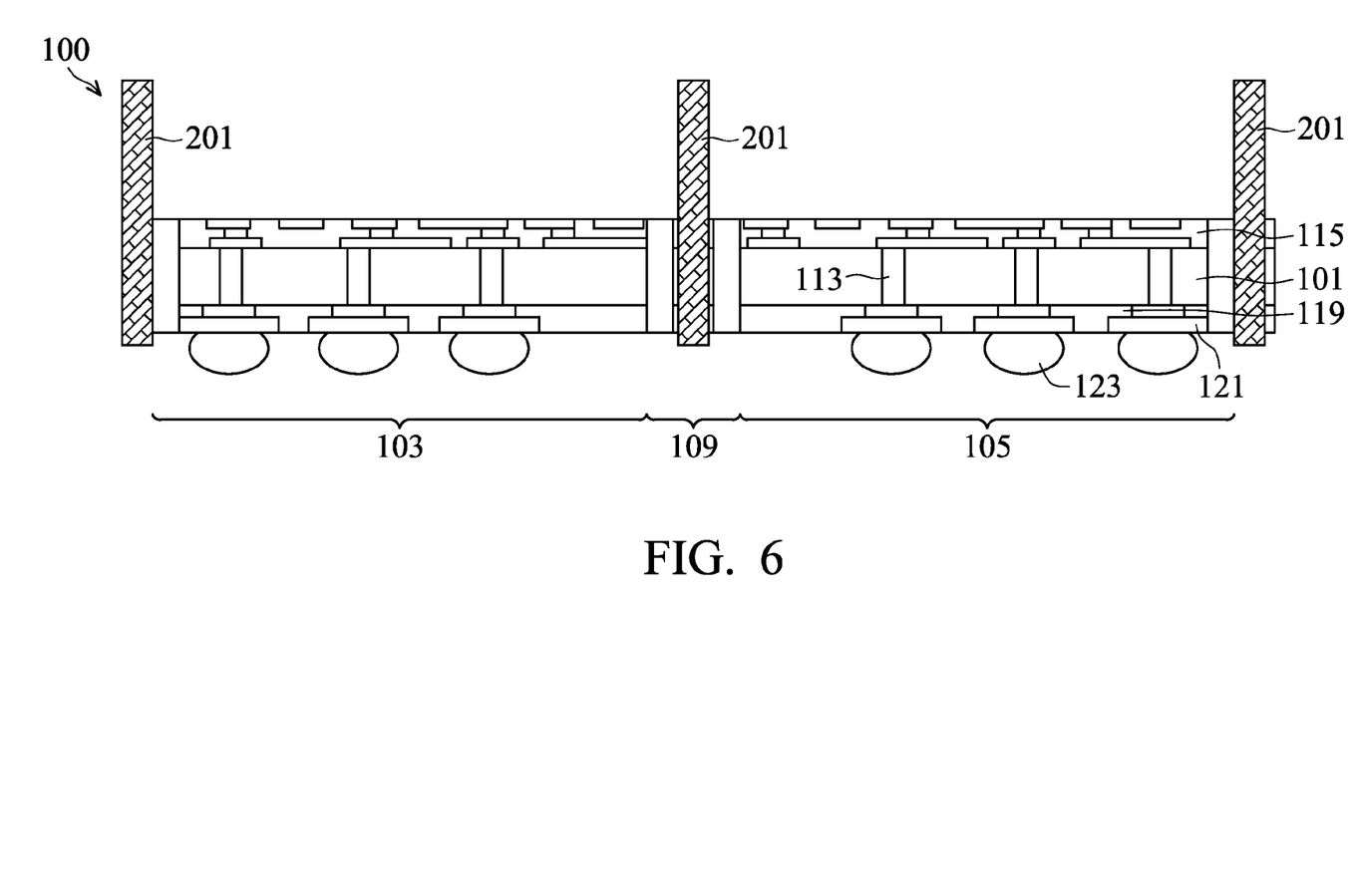
FIG. 6 illustrates a separation of the first interposer region from the second interposer region in accordance with an embodiment.

FIG. 6 illustrates a starting point for another embodiment in which the first interposer region 103 and the second interposer region 105 are separated from the interposer wafer 100 and from each other by, e.g., sawing through the first scribe region 107, the second scribe region 109, and the third scribe region 111 with the diamond coated saw 201. However, after the first interposer region 103 and the second interposer region 105 have been separated from each other, the first interposer region 103 and the second interposer region 105 may be rebonded together.

Figure 7:
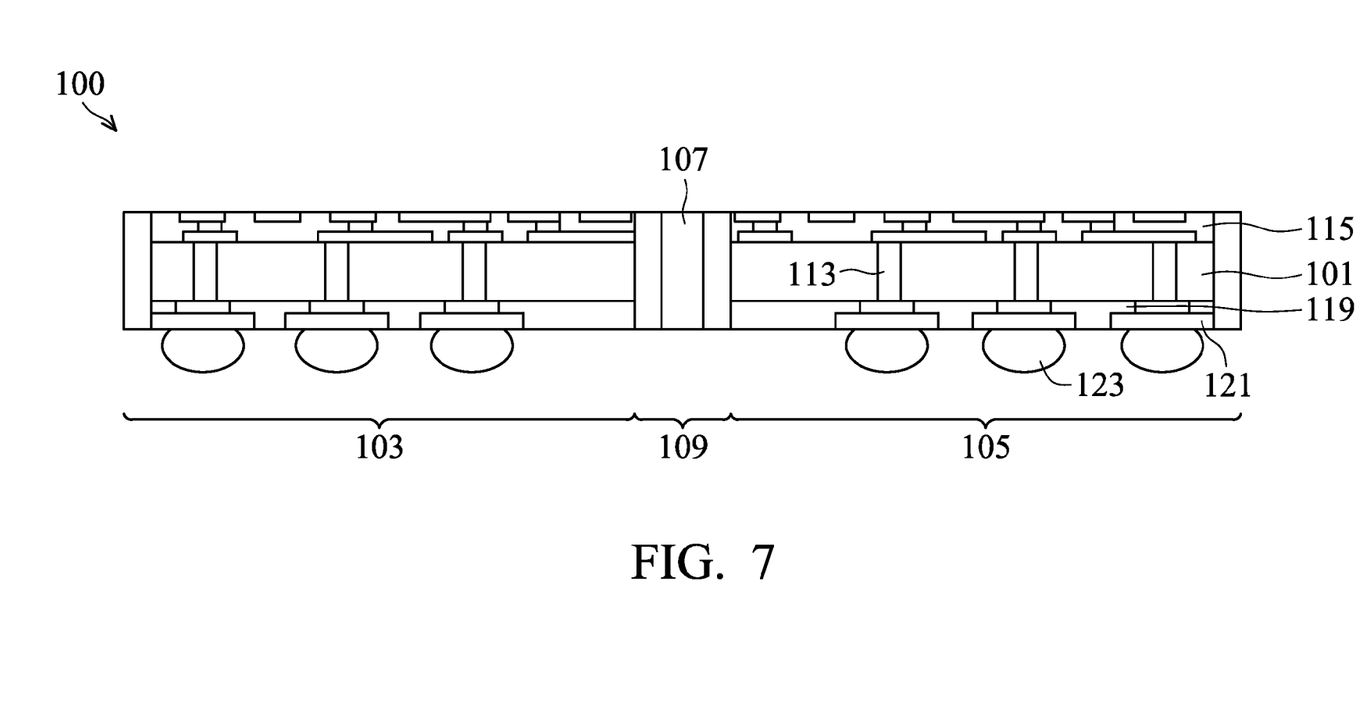
FIG. 7 illustrates an encapsulation of a region between the first interposer region and the second interposer region in accordance with an embodiment.

In an embodiment the first interposer region 103 and the second interposer region 105 may be bonded together using, e.g., a moulding device (not illustrated). For example, the first interposer region 103 and the second interposer region 105 may be placed within a cavity of the moulding device, and the cavity may be hermetically sealed. An encapsulant 701 may be placed within the cavity either before the cavity is hermetically sealed or else may be injected into the cavity through an injection port. In an embodiment the encapsulant 701 may be a molding compound resin such as polyimide, PPS, PEEK, PES, a heat resistant crystal resin, combinations of these, or the like.

Once the encapsulant 701 has been placed into the cavity such that the encapsulant 701 encapsulates the region between the first interposer region 103 and the second interposer region 105, the encapsulant 701 may be cured in order to harden the encapsulant 701 for optimum protection. While the exact curing process is dependent at least in part on the particular material chosen for the encapsulant 701, in an embodiment in which molding compound is chosen as the encapsulant 701, the curing could occur through a process such as heating the encapsulant 701 to between about 100° C. and about 130° C., such as about 125° C. for about 60 sec to about 3000 sec, such as about 600 sec. Additionally, initiators and/or catalysts may be included within the encapsulant 701 to better control the curing process.

However, as one having ordinary skill in the art will recognize, the curing process described above is merely an exemplary process and is not meant to limit the current embodiments. Other curing processes, such as irradiation or even allowing the encapsulant 701 to harden at ambient temperature, may alternatively be used. Any suitable curing process may be used, and all such processes are fully intended to be included within the scope of the embodiments discussed herein.

By encapsulating the region between the first interposer region 103 and the second interposer region 105, the encapsulant 701 serves as a bridge to physically connect the first interposer region 103 and the second interposer region 105 into the single interposer 200. This bridge serves as a replacement for the unscribed second scribe region 109 as discussed in the embodiments above, and provides for an additional level of flexibility as the first interposer region 103 and the second interposer region 105 may be separated and then rejoined if desired for a more efficient process integration.

Figure 8:
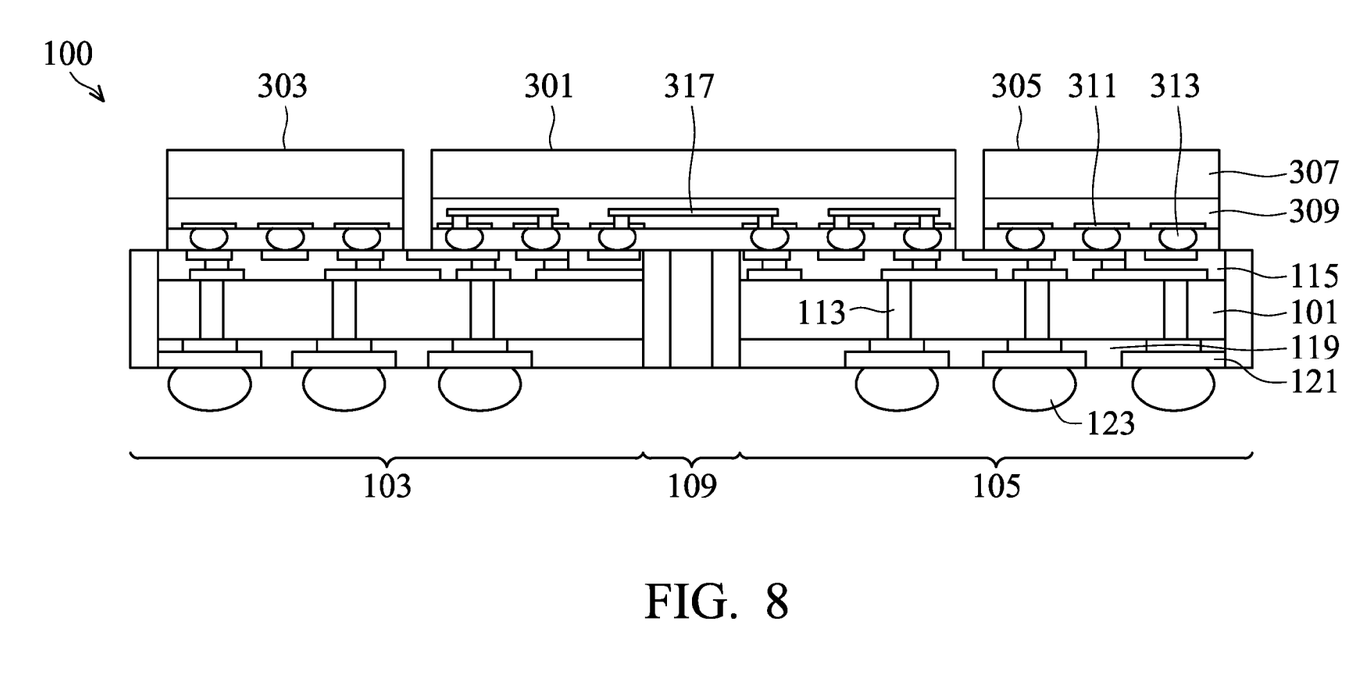
FIG. 8 illustrates a connection of a first semiconductor die, a second semiconductor die, and a third semiconductor die to the first interposer region and the second interposer region in accordance with an embodiment.

FIG. 8 illustrates the placement and bonding of the first semiconductor die 301, the second semiconductor die 303, and the third semiconductor die 305 onto the single interposer 200. In an embodiment the first semiconductor die 301, the second semiconductor die 303, and the third semiconductor die 305 may be placed onto the single interposer with the first contact pads 117 facing and aligned with the second external connectors 313. Once aligned, the second external connectors 313 and the first contact pads 117 may then be bonded together by contacting the second external connectors 313 to the first contact pads 117 and performing a reflow to reflow the material of the second external connectors 313 and bond to the first contact pads 117. Any suitable method of bonding, however, such as copper-copper bonding, may alternatively be utilized to bond the first semiconductor die 301, the second semiconductor die 303, and the third semiconductor die 305 to the single interposer 200.

In accordance with an embodiment, a semiconductor device comprising an interposer having a first side and a second side is provided. The interposer comprises a first region comprising first circuitry, a second region comprising second circuitry, and a third region between the first region and the second region, the third region being devoid of circuitry and extending from the first side to the second side. A conductive path is between the first region and the second region, the conductive path extending over the third region.

In accordance with another embodiment, a semiconductor device comprising an interposer with a scribe region between a first region and a second region is provided. A first contact is located in the first region and a second contact is located in the second region. A conductive path extends over the scribe region, the conductive path electrically connecting the first contact and the second contact.

In accordance with yet another embodiment, a method of manufacturing a semiconductor device comprising using a photolithographic process to form first circuitry in a first region of a wafer, to form second circuitry in a second region of the wafer, and to form a scribe region between the first region and the second region, wherein the photolithographic process uses a patterned energy exposure with a first dimension and the first region of the wafer having the first dimension is provided. The first region and the second region are separated from the wafer without separating the first region from the second region, and the first circuitry is connected to the second circuitry over the scribe region.

Although the present embodiments and their advantages have been described in detail, it should be understood that various changes, substitutions and alterations can be made herein without departing from the spirit and scope of the disclosure as defined by the appended claims. For example, the precise materials and methods of manufacturing may be altered or modified, and the order of process steps may be rearranged while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   an interposer having a first side and a second side, the interposer comprising:
      a first region comprising first circuitry;
      a second region comprising second circuitry; and
      a third region between the first region and the second region, the third region being devoid of circuitry and extending from the first side to the second side, wherein the third region is devoid of active devices; and
   a conductive path between the first region and the second region, the conductive path extending over the third region.

2. The semiconductor device of claim 1, wherein the third region is a scribe region between the first region and the second region.

3. The semiconductor device of claim 1, wherein the third region comprises an encapsulant.

4. The semiconductor device of claim 1, wherein the conductive path is part of a first semiconductor die.

5. The semiconductor device of claim 4, further comprising a second semiconductor die attached to the first region.

6. The semiconductor device of claim 1, wherein the first circuitry and the second circuitry have different patterns.

7. The semiconductor device of claim 1, wherein the first circuitry and the second circuitry are the same.

8. A semiconductor device comprising:
   an interposer with a first region free from functional circuitry between a second region and a third region, wherein the first region is free from active devices;
   a first contact located in the second region;
   a second contact located in the third region; and
   a conductive path extending over the first region, the conductive path electrically connecting the first contact and the second contact.

9. The semiconductor device of claim 8, wherein the conductive path is part of a first semiconductor die located over the first region.

10. The semiconductor device of claim 9, further comprising a second semiconductor die located over the second region.

11. The semiconductor device of claim 8, wherein the conductive path comprises a post-passivation interconnect located over the first region.

12. The semiconductor device of claim 11, further comprising a first semiconductor die in contact with the post-passivation interconnect.

13. The semiconductor device of claim 8, further comprising a seal ring located between the second region and the first region.

14. The semiconductor device of claim 8, further comprising through substrate vias extending through the second region.

15. A semiconductor device comprising:
   an interposer with a scribe region between a first region and a second region, wherein the first region comprises first circuitry and the second region comprises second circuitry;
   a conductive path extending to electrically connect the first circuitry to the second circuitry, wherein the conductive path remains outside of the scribe region.

16. The semiconductor device of claim 15, further comprising a first semiconductor die attached to a first surface of the interposer.

17. The semiconductor device of claim 16, wherein the conductive path is at least partially located within the first semiconductor die.

18. The semiconductor device of claim 17, further comprising a second semiconductor die attached to the first surface of the interposer.

19. The semiconductor device of claim 15, wherein the first circuitry has a first pattern and the second circuitry has the first pattern.

20. The semiconductor device of claim 15, wherein the first circuitry has a first pattern and the second circuitry has a second pattern different from the first pattern.

* * * * *